United States Patent [19]
Park et al.

[11] Patent Number: 5,814,551
[45] Date of Patent: Sep. 29, 1998

[54] METHODS FOR FORMING INTEGRATED CIRCUIT ISOLATION LAYERS USING OXYGEN DIFFUSING LAYERS

[75] Inventors: Chan-sik Park; Kyung-hwan Cho; Sung-han Lee; Jae-kyung Lee, all of Kyungki-do, Rep. of Korea

[73] Assignee: Samsung Electronics Co., Ltd., Kyungki-do, Rep. of Korea

[21] Appl. No.: 751,992

[22] Filed: Nov. 19, 1996

[30] Foreign Application Priority Data

Dec. 15, 1995 [KR]  Rep. of Korea ................. 1995-50695

[51] Int. Cl.$^6$ ....................................... H01L 21/76
[52] U.S. Cl. ......................... 438/448; 438/439; 438/297; 438/786
[58] Field of Search ..................... 438/297, 298, 438/362, 439, 448, 449, 786

[56] References Cited

U.S. PATENT DOCUMENTS

| | | | |
|---|---|---|---|
| 5,318,922 | 6/1994 | Lim et al. | 438/449 |
| 5,422,300 | 6/1995 | Pfiester et al. | 438/449 |
| 5,612,247 | 3/1997 | Itabashi | 438/449 |

*Primary Examiner*—Trung Dang
*Attorney, Agent, or Firm*—Myers Bigel Sibley & Sajovec

[57] ABSTRACT

A method for forming an integrated circuit isolation layer includes the steps of forming a patterned masking layer of a semiconductor substrate, forming an oxygen diffusing layer on the patterned masking layer and the exposed portion of the semiconductor substrate, and forming an isolation layer on the exposed portion of the substrate. In particular, the oxygen diffusing layer can be a layer of SiON, and the oxygen diffusing layer can have a thickness in the range of 30 Å to 150 Å. The oxygen diffusing layer and the mask layer can then be removed completing the isolation layer.

26 Claims, 9 Drawing Sheets

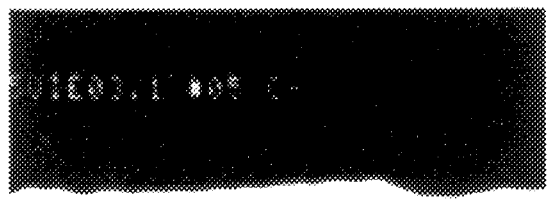
FIG.20A
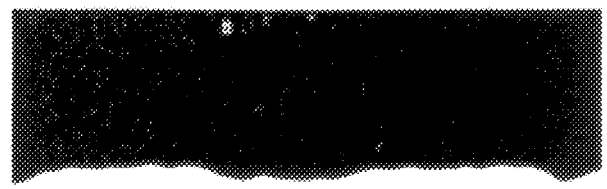
FIG.20B
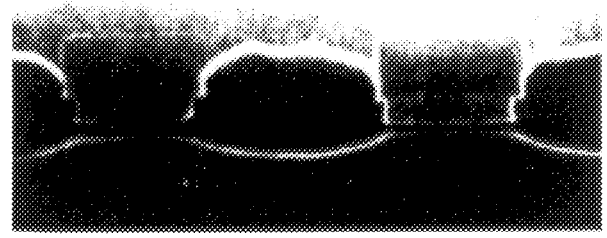
FIG.20C

METHODS FOR FORMING INTEGRATED CIRCUIT ISOLATION LAYERS USING OXYGEN DIFFUSING LAYERS

FIELD OF THE INVENTION

The present invention relates to the field of microelectronics and more particularly to the field of integrated circuit isolation regions.

BACKGROUND OF THE INVENTION

Integrated circuit devices typically include isolation layers which electrically isolate active regions of the substrate. In particular, isolation layers are typically formed by providing a field oxide layer between active regions of the substrate. The isolation layer is typically formed early in the manufacturing process, and this isolation layer generally determines the size of the active regions as well as process margins available during later steps of the manufacturing process. Accordingly, the reduction of size of isolation layers is an important factor when increasing the integration density of an integrated circuit device. It may thus be required to reduce the dimensions of an isolation layer in proportion to reductions in the overall dimensions of an integrated circuit device.

Isolation layers are typically provided using conventional methods including the local oxidation of silicon (LOCOS) and selective polysilicon oxidation (SEPOX). Each of these isolation techniques, however, has certain disadvantages when increasing the integration densities of integrated circuit devices.

The LOCOS technique is relatively simple and provides a low leakage current. When using the LOCOS technique, however, the bird's beak phenomenon may cause the field oxide layer to encroach on the active region of the substrate. Accordingly, the length of the field oxide layer is increased thus reducing the size of the active region. Highly integrated memory devices may thus be difficult to obtain because a suitable memory cell area may be difficult to fabricate. While the SEPOX technique is more complicated than the LOCOS technique, the SEPOX technique provides a shorter field oxide length. The SEPOX technique, however, may provide insufficient device isolation in highly integrated devices.

The conventional LOCOS and SEPOX methods will be discussed below with reference to FIGS. 1 through 9. Steps for fabricating a field oxide layer by the conventional LOCOS method are illustrated in FIGS. 1 through 4. As shown in FIG. 1, a pad oxide layer 12 and a nitride layer 14 are sequentially formed on a semiconductor substrate 10. A patterned photoresist layer 16 is formed on the nitride layer 14 exposing a portion of the nitride layer 14 adjacent a portion of the substrate 10 on which the field oxide layer will be formed. The exposed portion of the nitride layer 14 is then anisotropically etched to form the patterned nitride masking layer 14a using the patterned photoresist layer 16 as an etching mask. The nitride masking layer 14a exposes a portion of the pad oxide layer 12 as shown in FIG. 2.

The patterned photoresist layer is removed and the resulting structure is oxidized as shown in FIG. 3. As a result of oxidation, an oxide layer 18a is grown in the silicon substrate under the exposed portion of the pad oxide layer 12. The nitride masking layer 14a and the pad oxide layer 12 are then removed leaving the field oxide layer 18b on the substrate 10 as shown in FIG. 4. The resulting field oxide layer 18b has a bird's beak 20 at each end. As shown, the bird's beak 20 covers portions of the substrate 10 which would otherwise make up a portion of the active region. Accordingly, the use of the LOCOS technique to form the isolation region may result in a reduction of the area available for the active region.

Furthermore, a spontaneous oxide layer may be formed on the nitride masking layer 14a during the step of forming the oxidation layer 18a. Accordingly, the nitride masking layer 14a may not be completely removed unless the spontaneous oxide layer is first removed by a wet etch. In particular, the nitride layer 14a is generally removed using phosphoric acid, and the phosphoric acid may not effectively remove the spontaneous oxide layer. The addition of the wet etch to remove the spontaneous oxide layer, however, may also result in the etching of the field oxide layer 18b. The resulting field oxide layer 18b may thus be thinner than desired.

Steps of the conventional SEPOX technique for forming a field oxide layer are illustrated in FIGS. 5 through 9. As shown in FIG. 5, a pad oxide layer 52, a polysilicon layer 54, and a nitride layer 56 are sequentially formed on a semiconductor substrate 50.

The nitride layer 56 is then patterned using the photoresist layer 58 to expose portions of the polysilicon layer adjacent isolation regions of the substrate as shown in FIG. 6. In particular, exposed portions of the nitride layer are etched using the patterned photoresist layer 58 as an etching mask to form the nitride masking layer 56a. The nitride masking layer 58a thus exposes portions of the polysilicon layer 54 where the field oxide layer will be formed.

The photoresist pattern is removed and the resulting structure is thermally treated in an atmosphere including oxygen as shown in FIG. 7. The exposed portion of the polysilicon layer is thus converted to an oxide layer 60 and the portions of the polysilicon layer covered by the nitride masking layer 56a remain as the polysilicon layer 54a. Although the length of the oxide layer thus formed is reduced in comparison to that formed by the LOCOS technique, both ends of the oxide layer 60 form the bird's beak 62 which encroaches on the active region.

The nitride masking layer and the polysilicon layer are removed by an anisotropic etch to expose the surface of the pad oxide layer 52 as shown in FIG. 8. A portion of the polysilicon layer under the bird's beak 62, however, is not etched during the anisotropic etch. Accordingly, the polysilicon pieces 54b remain between the pad oxide layer 52 and the bird's beaks of the oxide layer 60. The polysilicon pieces 54b are converted into oxide during an oxidation step thus completing the field oxide layer 62a. FIGS. 19A through 19C are pictures of a field oxide layer formed using conventional techniques. In particular, FIGS. 19A and 19B are cross-sectional views, and FIG. 19C is a top view.

As discussed above, when forming field oxide layers according to conventional isolation techniques, oxygen can diffuse through the pad oxide layer to the substrate layer beneath the nitride masking layer. This diffusion causes oxide to grow under and lift the nitride masking layer edges. The bird's beak is thus formed extending the field oxide layer laterally over the active region of the substrate. Accordingly, conventional isolation techniques may impede the development of integrated circuit devices having higher levels of integration.

SUMMARY OF THE INVENTION

It is therefore an object of the present invention to provide improved methods for forming isolation layers.

It is another object of the present invention to provide methods for forming isolation layers which reduce the bird's beak.

These and other objects are provided according to the present invention by methods including the steps of forming a patterned masking layer on a semiconductor substrate, forming an oxygen diffusing layer on the exposed portion of the semiconductor substrate, and forming an isolation layer on the exposed portion of the substrate. Preferably, the isolation layer is a field oxide layer, the oxygen diffusing layer is a layer of SiON, and the oxygen diffusing layer is also formed on the patterned masking layer. Accordingly, the oxygen diffusing layer reduces lifting of the nitride masking layer during the step of forming the isolation layer.

The isolation layer can be completed by removing the oxygen diffusing layer and the masking layer. The oxygen diffusing layer thus allows removal of any spontaneous oxide formed on the masking layer during the step of forming the isolation layer. Accordingly, the masking layer can be removed without thinning the isolation layer.

The step of forming the isolation layer can include thermally oxidizing the portion of the semiconductor substrate exposed by the masking layer through the oxygen diffusing layer. In particular, an oxygen diffusing layer such as SiON allows water vapor to pass therethrough during a high temperature wet oxidation. Furthermore, the thermal oxidation can be performed at a temperature in the range of 950° C. to 1,100° C.

In addition, the patterned masking layer can be a patterned nitride layer, and the semiconductor substrate can include a pad oxide layer adjacent the patterned masking layer and the oxygen diffusing layer. Furthermore, the substrate can include a polysilicon layer adjacent the patterned masking layer and the oxygen diffusing layer so that the step of forming the isolation layer includes oxidizing the polysilicon layer through the oxygen diffusing layer.

According to the methods of the present invention, isolation regions can be formed having a reduced bird's beak.

BRIEF DESCRIPTION OF THE DRAWINGS

FIGS. 20A through 20C are SEM photographs illustrating cross-sectional and surface views of a field oxide layer formed according to the present invention.

DETAILED DESCRIPTION

Figure 1:
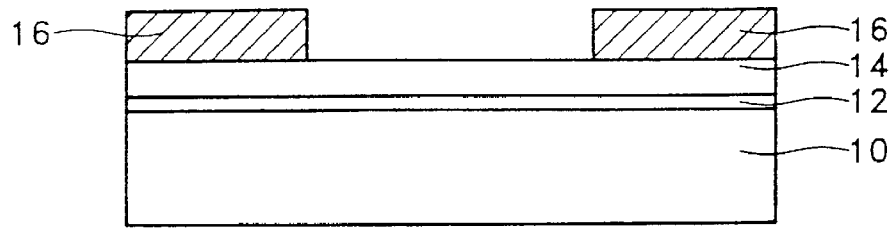
FIGS. 1 through 4 are cross-sectional views illustrating steps of a LOCOS method for forming a field oxide layer according to the prior art.
Figure 2:
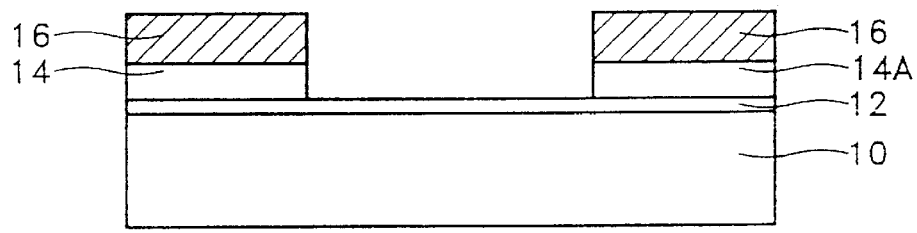
Figure 3:
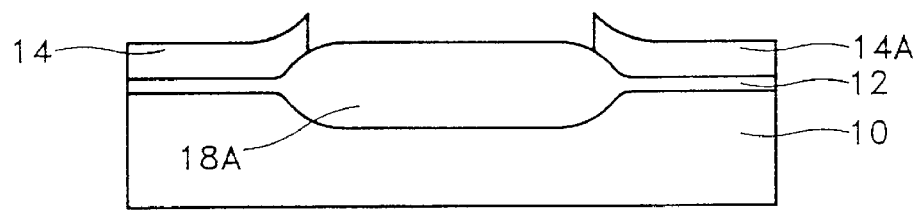
Figure 4:
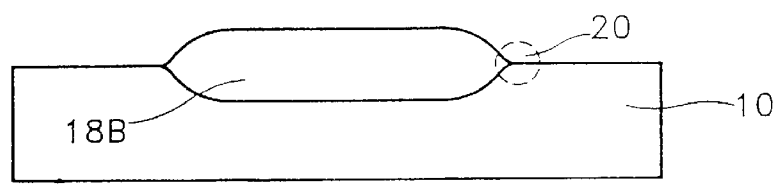
Figure 5:
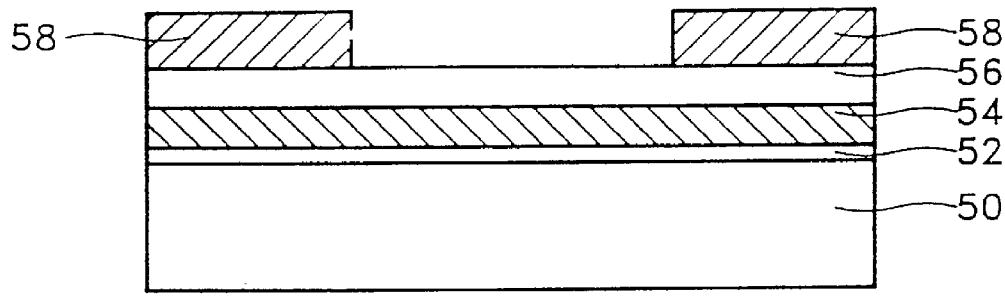
FIGS. 5 through 9 are cross-sectional views illustrating steps of a SEPOX method for forming a field oxide layer according to the prior art.
Figure 6:
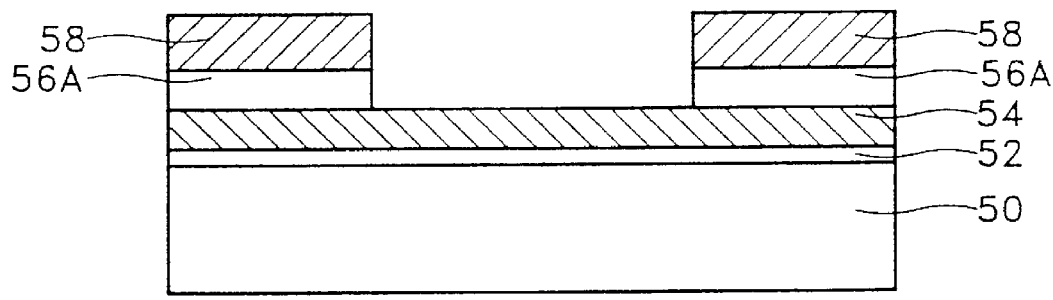
Figure 7:
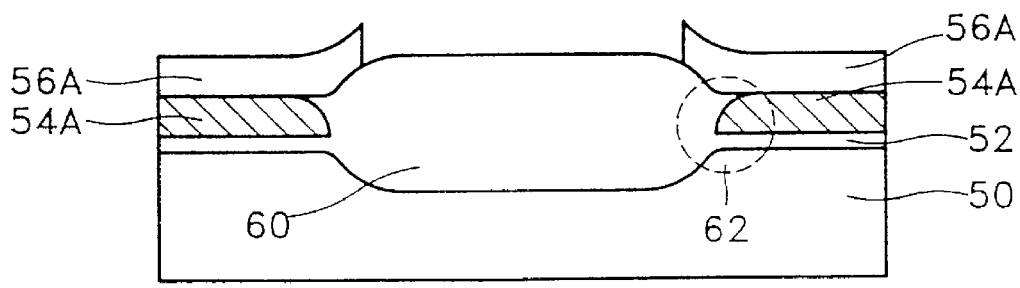
Figure 8:
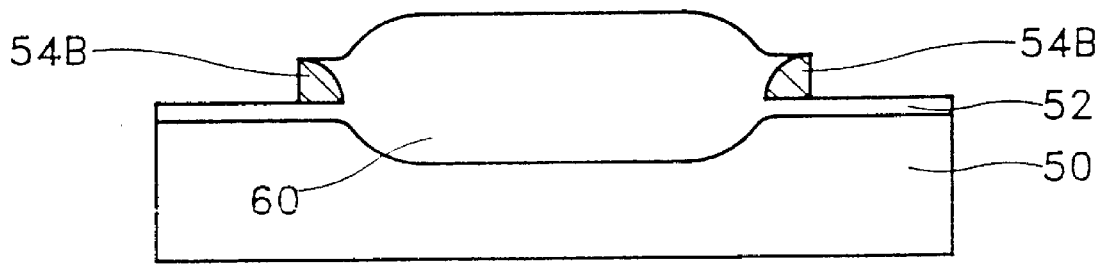
Figure 9:
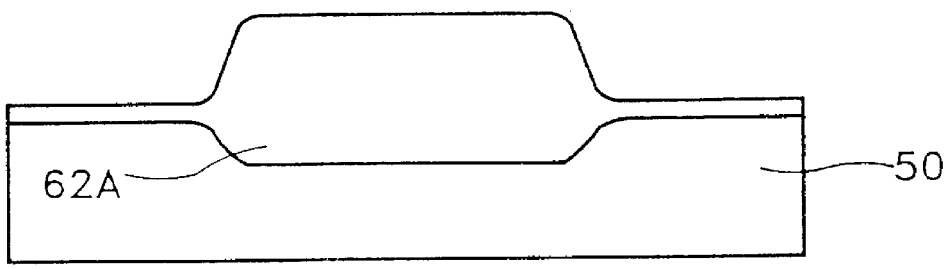

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 10:
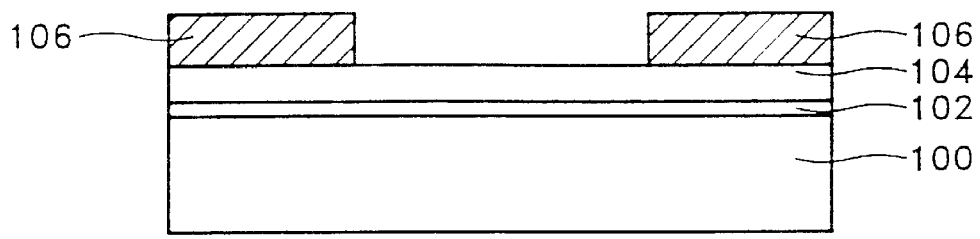
FIGS. 10 through 13 are cross-sectional views illustrating steps of a LOCOS method for forming isolation layers according to the present invention.

Steps of a method for forming an isolation region according to a LOCOS method of the present invention are illustrated in FIGS. 10 through 13. As shown in FIG. 10, a pad oxide layer 102, a nitride layer 104, and a patterned photoresist layer 106 are sequentially formed on the semiconductor substrate 100. The pad oxide layer 102 can have a thickness in the range of 150 Å to 300 Å, and the nitride layer 104 can have a thickness in the range of 1,000 Å to 2,000 Å. Preferably, the pad oxide layer 102 has a thickness of approximately 250 Å, and the nitride layer 104 has a thickness of approximately 1,500 Å. The patterned photoresist layer 106 defines active regions of the structure.

Figure 11:
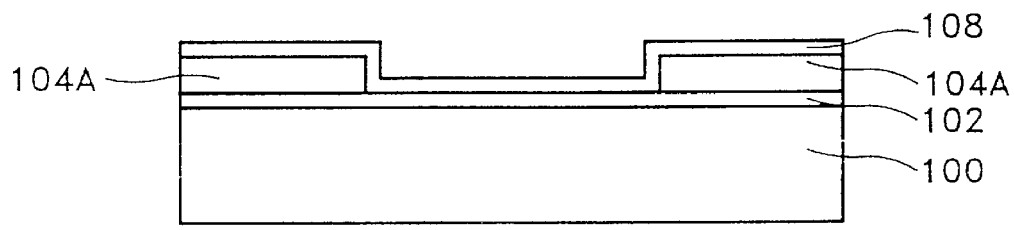

The nitride layer is patterned to form the nitride masking layer 104a using the patterned photoresist layer 106 as a mask as shown in FIG. 11. The nitride masking layer exposes portions of the pad oxide layer 102 adjacent portions of the substrate 100 on which the field oxide layer will be formed. The nitride layer is preferably patterned by anisotropic etching using the patterned photoresist layer as an etching mask.

The patterned photoresist layer is then removed and an oxygen diffusing layer 108 is deposited on the nitride masking layer 104a and the exposed portions of the pad oxide layer 102 as shown in FIG. 11. More particularly, the oxygen diffusing layer 108 can be a layer of SiON. The SiON layer is formed using a gas mixture including $NH_4^+$, $N_2O^{2+}$, and a gas selected from either silane ($SiH_4$) or dichlorosilane ($SiH_2Cl_2$). More particularly, the gas mixture can include $NH_4^+$, $N_2O^{2+}$, and $SiH_2Cl_2$ such that a volumetric ratio $SiH_2Cl_2:NH_4^+$ is in the range of 1:5 to 1:15, and the volumetric ratio $SiH_2Cl_2:N_2O^{2+}$ is the range of 1:5 to 1:15. Alternately, the gas mixture can include $NH_4^+$, $N_2O^{2+}$, and $SiH_4$ such that the volumetric ratio $SiH_4:NH_4^+$ is the range of 1:5 to 1:15, and the volumetric ratio $SiH_4:N_2O^{2+}$ is in the range of 1:5 to 1:15. The SiON layer is deposited to a thickness in the range of 30 Å to 150 Å at a temperature in the range of 750° C. to 850° C. by a low pressure chemical vapor deposition (LPCVD) technique. The SiON layer is preferably deposited to a thickness of about 50 Å at a temperature of about 800° C.

Figure 12:
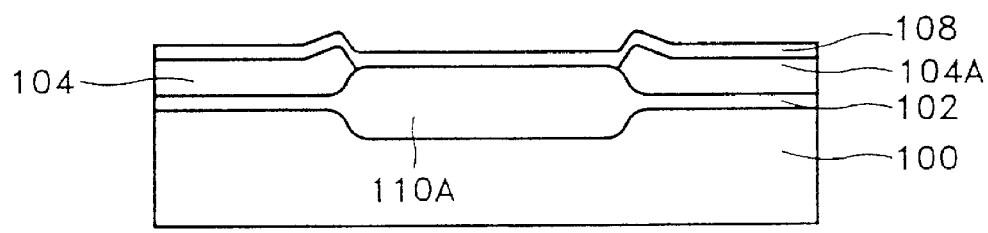

The exposed portion of the semiconductor substrate with the oxygen diffusing layer 108 thereon is oxidized by a high temperature wet oxidation technique as shown in FIG. 12. Accordingly, the oxide layer 110a is grown from portions of the silicon substrate 100 not covered by the nitride masking layer 104a. Because an oxygen diffusing layer such as SiON has properties of both oxide and nitride layers, water vapor ($H_2O$) diffuses through the oxygen diffusing layer to the substrate 100 where the oxide layer 110a is formed. Furthermore, the nitride masking layer 104a is pressed down by the oxygen diffusing layer 108. Accordingly, lifting of the edges of the nitride masking layer 104a is reduced during the oxidation step thereby reducing the generation of the bird's beak.

Figure 13:
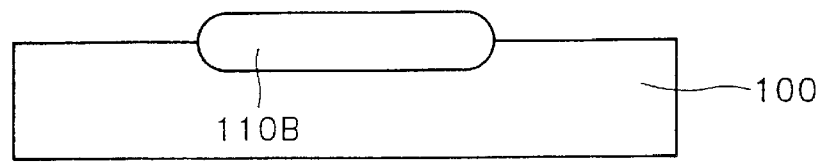

The field oxide layer 110b is completed by removing the oxygen diffusing layer 108, the nitride masking layer 104a, and portions of the pad oxide layer 102 under the nitride masking layer as shown in FIG. 13. More particularly, these layers can be removed using a wet etch. In contrast with the methods of the prior art, the oxygen diffusing layer 108 prevents etching of the oxide layer 110*a* during the wet etch used to remove the spontaneous oxide formed on the nitride masking layer 104*a*. Accordingly, a wet etch can be used to remove this spontaneous oxide without etching the field oxide layer, and the nitride masking layer can then be completely removed with the subsequent etch. Accordingly, the problem of thinning the field oxide layer can be reduced.

Figure 14:
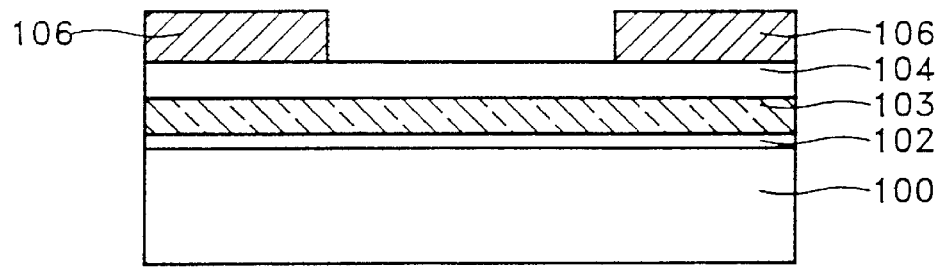
FIGS. 14 through 17 are cross-sectional views illustrating steps of a SEPOX method for forming isolation layers according to the present invention.

A SEPOX method for forming an isolation region according to the present invention is illustrated in FIGS. 14 through 17. As shown in FIG. 14, a pad oxide layer 102, a polysilicon layer 103, and a nitride layer 104 are sequentially formed on the surface of the semiconductor substrate 100. The pad oxide layer 102 is formed to a thickness in the range of 150 Å to 300 Å, the polysilicon layer 103 is formed to a thickness in the range of 300 Å to 800 Å, and the nitride layer 104 is formed to a thickness in the range of 1,000 Å to 2,000 Å. Preferably, the pad oxide layer 102 is formed to a thickness of about 160 Å, the polysilicon layer 103 is formed to a thickness of about 700 Å, and the nitride layer 104 is formed to a thickness of about 1,500 Å. A patterned photoresist layer 106 is then formed on the nitride layer 104, and portions of the nitride layer 104 are exposed where a field oxide layer is to be formed. The patterned photoresist layer 106 covers portions of the nitride layer over portions of the substrate which will be active.

Figure 15:
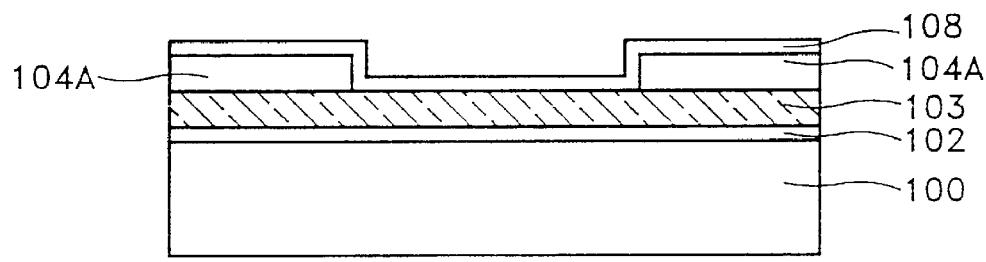

The nitride layer 104 is etched using the patterned photoresist layer 106 as an etching mask to form the nitride masking layer 104*a* as shown in FIG. 15. The nitride masking layer 104*a* exposes portions of the polysilicon layer 103 which will be converted to a field oxide layer. After removing the patterned photoresist layer 106, the oxygen diffusing layer 108 is formed on the nitride masking layer 104*a* and the exposed portions of the polysilicon layer 103. As before, the oxygen diffusing layer can be formed from SiON. As before, the SiON layer can be formed using a gas mixture including $NH_4^+$, $N_2O^{2+}$, and either silane ($SiH_4$) or dichlorosilane ($SiH_2Cl_2$). More particularly, the gas mixture can be provided such that the volumetric ratio $SiH_2Cl_2:NH_4^+$ or $SiH_4:NH_4^+$ is in the range of 1:5 to 1:15, and the volumetric ratio $SiH_2Cl_2:N_2O^{2+}$ or $SiH_4:N_2O^{2+}$ is in the range of 1:5 to 1:15. The SiON layer can be deposited to a thickness in the range of 30 Å to 100 Å at a temperature in the range of 750° C. to 850° C. by a low pressure chemical vapor deposition (LPCVD) technique. Preferably, the SiON layer is deposited to a thickness of about 50 Å at a temperature of about 800° C.

Figure 16:
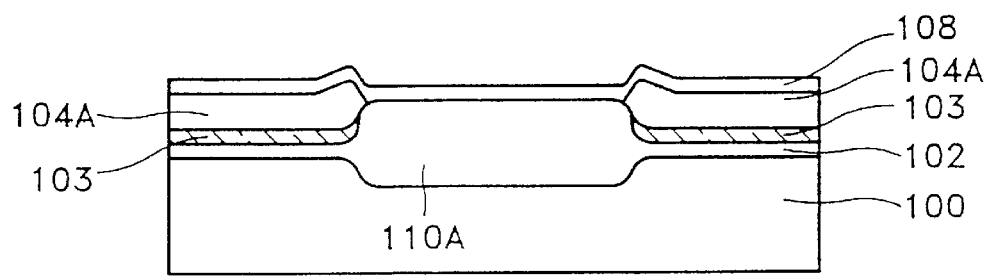

The field oxide layer 110 is then formed as shown in FIG. 16. In particular, a high temperature wet oxidation step is performed to oxidize portions of the polysilicon layer 103 exposed by the nitride masking layer 104*a*. In addition, portions of the substrate 100 may also be oxidized. The exposed portions of the polysilicon layer 103 are thus converted to oxide. As discussed above, water vapor ($H_2O$) diffuses through the oxygen diffusing layer 108 to reach the polysilicon layer 103 where the field oxide layer is formed. Again, the nitride masking layer 104*a* is pressed down by the oxygen diffusing layer 108 thus reducing lifting of the edges of the nitride masking layer during the oxidation step. Accordingly, the generation of the bird's beak is reduced.

Figure 17:
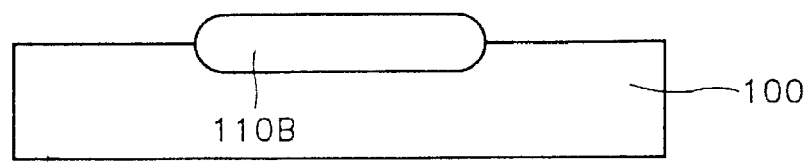

The field oxide layer 110*b* is completed by removing the oxygen diffusing layer 108, the nitride masking layer 104*a*, remaining portions of a polysilicon layer 103, and the pad oxide layer 102 as shown in FIG. 17. Any polysilicon remaining at the end of the field oxide layer can then be oxidized to planarize the end of the field oxide layer to complete the field oxide layer 110.

The present invention will now be described in more detail by discussing particular examples. It should be noted, however, that the present invention is not limited to these examples, and modifications and changes may be affected within the spirit and scope of the invention by one having skill in the art.

FIRST EXAMPLE

In this first example, an experimental group of SiON oxygen diffusing layers having respective thicknesses of 35 Å, 70 Å, and 130 Å are provided on a substrate which is then oxidized by a high temperature wet oxidation step. These different SiON oxygen diffusing layers are used to verify the growth feasibility of an oxide layer under a SiON layer. Accordingly, the experimental group including the above-mentioned SiON layers is used to form field oxide layers using the same conditions as those used to form a comparative group of field oxide layers having a thickness of about 4,500 Å. The thicknesses of the resulting oxide layers are illustrated below in Table 1.

TABLE 1

|  | Experiment | Comparison | Experimental Group (Thickness of SiON Å) | | |
|---|---|---|---|---|---|
|  | No. | group | 35Å | 70Å | 130Å |
| Thickness | 1 | 4584 | 4163 | 2493 | 385 |
| of oxide | 2 | 4494 | 4135 | 2907 | 561 |
| layer (Å) | 3 | 4586 | 4088 | 2615 | 363 |
|  | Mean | 4555 | 4129 | 2672 | 436 |

Table 1

Figure 18A:
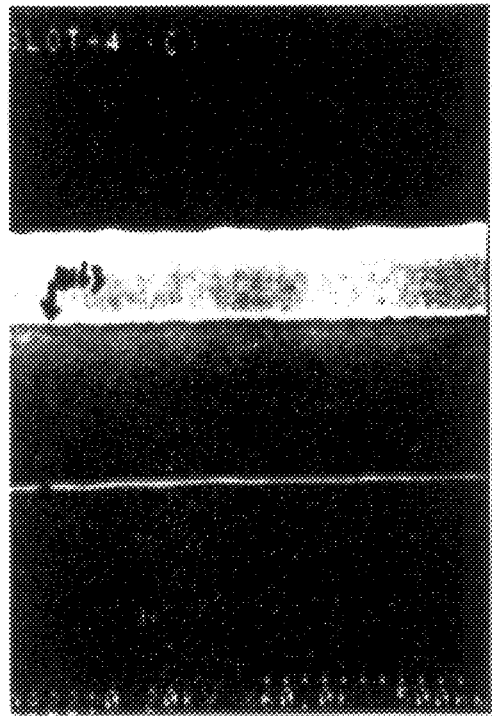
FIGS. 18A through 18C are scanning electron microscopy (SEM) photographs illustrating cross-sectional and surface views of a field oxide layer formed according to the present invention.
Figure 18B:
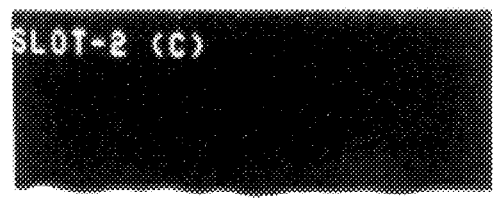
Figure 18B:
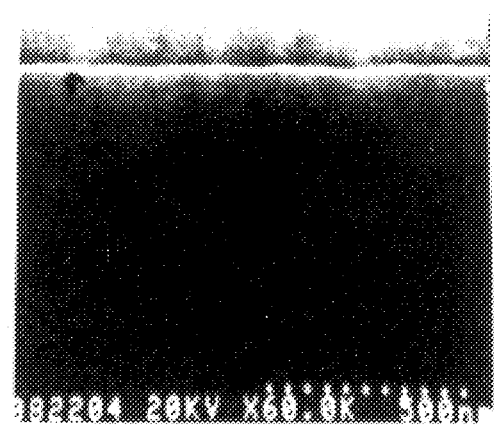
Figure 18C:
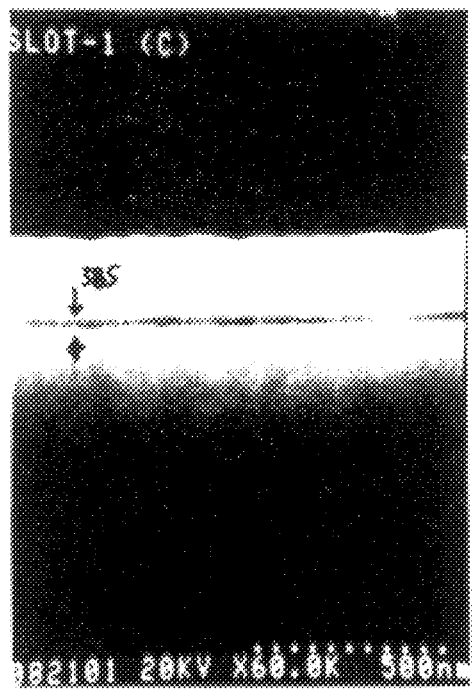

SEM photographs of the results of Experiment No. 1 for the experimental groups are illustrated in FIGS. 18A through 18C. When using an SiON layer having a thickness of about 35 Å, the resulting oxide layer was 4,163 Å thick as shown in FIG. 18A. When using an SiON layer having a thickness of about 70 Å, the oxide layer was 2,493 Å thick as shown in FIG. 18B. When using an SiON layer having a thickness of about 130 Å, the oxide layer was 385 Å thick as shown in FIG. 18C. As shown in Table 1 and in FIGS. 18A through 18C, a silicon layer covered by an SiON layer can be oxidized because the SiON layer exhibits properties of both oxide and nitride layers. Furthermore, the thickness of the oxide layer formed under the SiON layer can be controlled by adjusting a thickness of the SiON layer.

SECOND EXAMPLE

A 250 Å pad oxide layer and 1,500 Å nitride layer were formed on a semiconductor substrate. The nitride layer was anisotropically etched using a photolithographic technique to form a nitride masking layer. In particular, the nitride masking layer exposed portions of the pad oxide layer adjacent portions of the substrate on which the field oxide layer would be formed. A gas mixture having the volumetric ratio $SiH_2Cl_2:NH_4^+:N_2O^{2+}$ of about 1:10:10 was provided at a temperature of about 800° C. to deposit an SiON layer by a low pressure chemical vapor deposition (LPCVD) technique. In particular, the SiON layer was deposited on the nitride masking layer and exposed portions of the pad oxide layer to a thickness of about 50 Å. A high temperature wet oxidation was then performed to form a 4,500 Å thick oxide layer on portions of the silicon substrate exposed by the nitride masking layer. As before, the oxide formed on the substrate despite the fact that the substrate was covered with the SiON layer because water vapor diffused through the SiON layer. The SiON layer and the nitride masking layer were then sequentially etched to leave the field oxide layer.

THIRD EXAMPLE

A 160 Å pad oxide layer, a 700 Å polysilicon layer, and a 1,500 Å nitride layer were respectively formed on a semiconductor substrate. The nitride layer was then etched using a photolithographic technique to form a nitride masking layer exposing portions of the polysilicon layer corresponding to an isolation region of the substrate. A gas mixture having a volumetric ratio $SiH_4:NH_4^+:N_2O^{2+}$ of 1:10:10 was provided at a temperature of about 800° C. to form an SiON layer having a thickness of 50 Å on the nitride masking layer and the exposed portions of the polysilicon layer. An oxidation was performed so that the exposed portions of the polysilicon layer were converted to a 3,500 Å thick oxide layer. As before, the polysilicon layer oxidized despite the fact that it was covered by the SiON layer because water vapor diffused through the SiON layer. The SiON layer, the nitride masking layer, and the non-oxidized portions of a polysilicon layer were then sequentially etched to leave the field oxide layer.

Comparative Example

Figure 19A:
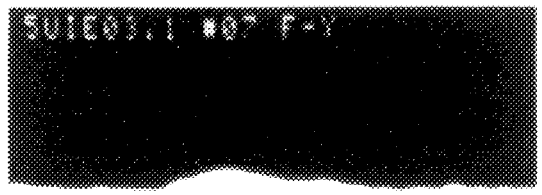
FIGS. 19A through 19C are SEM photographs illustrating cross-sectional and surface views of a field oxide layer formed according to the prior art.
Figure 19B:
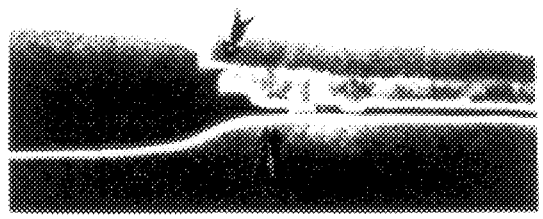
Figure 19C:
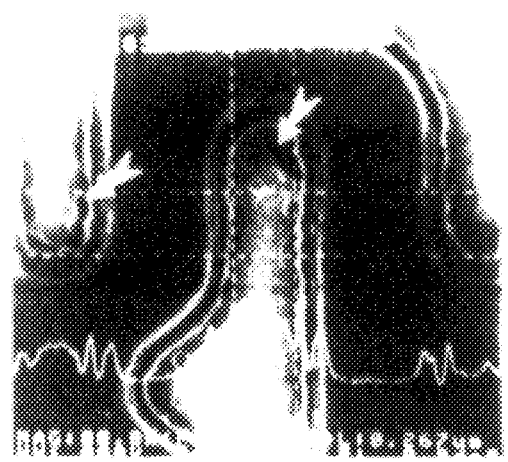

A field oxide was formed using the steps discussed above in the third example with the exception that the high temperature wet oxidation was performed without forming an SiON layer on the nitride masking layer. FIGS. 19A through 19C are SEM photographs of the field oxide layer formed according to the comparative example. In particular, FIGS. 19A and 19B are cross-sectional views, and FIG. 19C is a top view.

FIGS. 20A through 20C are SEM photographs of a field oxide layer formed as discussed above in the third example using an SiON layer having a thickness of 50 Å. In particular, FIGS. 20A and 20B are cross-sectional views, and FIG. 20C is a top view.

In comparing FIGS. 19A and 19B with FIGS. 20A and 20B, it will be understood that the bird's beak portion of the field oxide layer (indicated by arrows) was reduced in the field oxide layer manufactured using the SiON oxygen diffusing layer of the present invention. With reference to FIG. 19C, the field oxide layer formed according to the comparative example included anomalies in that the surface characteristics of the active region were diminished due to stress caused by the bird's beak. In addition, the critical dimensions (CD) were diminished. In contrast, the field oxide layer formed according to the present invention had a reduced bird's beak and the surface state was evenly formed.

Using the methods of the present invention, isolation regions can be provided having a reduced bird's beak. Because the SiON oxygen diffusing layer has properties of both a nitride and an oxide, water vapor including oxygen can be provided to the substrate or other layers beneath the diffusing layer from which the field oxide layer will be formed. This oxygen diffusing layer reduces lifting of the nitride layer thus suppressing generation of the bird's beak. This oxygen diffusing layer thus reduces the expansion of the field oxide layer into the active regions of the substrate thereby allowing an increase in an integration density of an integrated circuit device. Furthermore, an SiON oxygen diffusing layer can protect the field oxide layer when removing a spontaneous oxide from the nitride masking layer. In other words, the spontaneous oxide can be removed from the nitride masking layer without etching the field oxide layer.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming an integrated circuit isolation layer, said method comprising the steps of:

forming a patterned masking layer on a semiconductor substrate defining an exposed portion of said semiconductor substrate;

forming an oxygen diffusing layer on said exposed portion of said semiconductor substrate; and forming an isolation layer on said exposed portion of said substrate;

wherein said semiconductor substrate includes a polysilicon layer adjacent said patterned masking layer and said oxygen diffusing layer so that said step of forming said isolation layer comprises oxidizing said polysilicon layer through said oxygen diffusing layer.

2. A method according to claim 1 wherein said oxygen diffusing layer is also formed on said patterned masking layer.

3. A method according to claim 1 wherein said step of forming said oxygen diffusing layer comprises forming a layer of SiON.

4. A method according to claim 3 wherein said layer of SiON has a thickness in the range of 30 Å to 150 Å.

5. A method according to claim 3 wherein said step of forming said layer of SiON comprises providing a gas mixture including $NH_4^+$, $N_2O^{2+}$, and a gas selected from the group consisting of silane ($SiH_4$) and dichlorosilane ($SiH_2Cl_2$).

6. A method for forming an integrated circuit isolation layer, said method comprising the steps of:

forming a patterned masking layer on a semiconductor substrate defining an exposed portion of said semiconductor substrate;

forming an oxygen diffusing layer on said exposed portion of said semiconductor substrate; and forming an isolation layer on said exposed portion of said substrate;

wherein said step of forming said oxygen diffusing layer comprises forming a layer of SiON;

wherein said step of forming said layer of SiON comprises providing a gas mixture including $NH_4^+$, $N_2O^{2+}$, and a gas selected from the group consisting of silane ($SiH_4$) and dichlorosilane ($SiH_2Cl_2$); and wherein said gas mixture includes $NH_4^+$, $N_2O^{2+}$, and $SiH_2Cl_2$ such that a volumetric ratio of $SiH_2Cl_2:NH_4^+$ is in the range of 1:5 to 1:15, and a volumetric ratio of $SiH_2Cl_2:N_2O^{2+}$ is in the range of 1:5 to 1:15.

7. A method for forming an integrated circuit isolation layer, said method comprising the steps of:

forming a patterned masking layer on a semiconductor substrate defining an exposed portion of said semiconductor substrate;

forming an oxygen diffusing layer on said exposed portion of said semiconductor substrate; and forming an isolation layer on said exposed portion of said substrate;

wherein said step of forming said oxygen diffusing layer comprises forming a layer of SiON;

wherein said step of forming said layer of SiON comprises providing a gas mixture including $NH_4^+$, $N_2O^{2+}$, and a gas selected from the group consisting of silane (SiH$_4$) and dichlorosilane (SiH$_2$Cl$_2$); and wherein said gas mixture includes NH$_4^+$, N$_2$O$^{2+}$, and SiH$_4$ such that a volumetric ratio of SiH$_4$:NH$_4^+$ is in the range of 1:5 to 1:15, and a volumetric ratio of SiH$_4$:N$_2$O$^{2+}$ is in the range of 1:5 to 1:15.

8. A method according to claim 1 wherein said step of forming said isolation layer comprises thermally oxidizing said exposed portion of said semiconductor substrate through said oxygen diffusing layer.

9. A method according to claim 8 wherein said thermal oxidation is performed at a temperature in the range of 950° C. to 1,100° C.

10. A method according to claim 1 wherein said step of forming said isolation layer is followed by the step of:

removing said oxygen diffusing layer and said masking layer.

11. A method according to claim 1 wherein said patterned masking layer comprises a patterned nitride layer.

12. A method according to claim 1 wherein said semiconductor substrate includes a pad oxide layer adjacent said patterned masking layer and said oxygen diffusing layer.

13. A method for forming an integrated circuit isolation layer, said method comprising the steps of:

forming a polysilicon layer on a semiconductor substrate;

forming a patterned masking layer on said polysilicon layer opposite said semiconductor substrate defining an exposed portion of said polysilicon layer;

forming an oxygen diffusing layer on said exposed portion of said polysilicon layer; and forming an isolation layer on said exposed portion of said polysilicon layer.

14. A method according to claim 13 wherein said oxygen diffusing layer is also formed on said patterned masking layer.

15. A method according to claim 13 wherein said step of forming said oxygen diffusing layer comprises forming a layer of SiON.

16. A method according to claim 15 wherein said layer of SiON has a thickness in the range of 30 Å to 150 Å.

17. A method according to claim 15 wherein said step of forming said layer of SiON comprises providing a gas mixture including NH$_4^+$, N$_2$O$^{2+}$, and a gas selected from the group consisting of silane (SiH$_4$) and dichlorosilane (SiH$_2$Cl$_2$).

18. A method according to claim 17 wherein said gas mixture includes NH$_4^+$, N$_2$O$^{2+}$, and SiH$_2$Cl$_2$ such that a volumetric ratio of SiH$_2$Cl$_2$:NH$_4^+$ is in the range of 1:5 to 1:15, and a volumetric ratio of SiH$_2$Cl$_2$:N$_2$O$^{2+}$ is in the range of 1:5 to 1:15.

19. A method according to claim 17 wherein said gas mixture includes NH$_4^+$, N$_2$O$^{2+}$, and SiH$_4$ such that a volumetric ratio of SiH$_4$:NH$_4^+$ is in the range of 1:5 to 1:15, and a volumetric ratio of SiH$_4$:N$_2$O$^{2+}$ is in the range of 1:5 to 1:15.

20. A method according to claim 13 wherein said step of forming said isolation layer comprises thermally oxidizing said exposed portion of said polysilicon layer through said oxygen diffusing layer.

21. A method according to claim 18 wherein said thermal oxidation is performed at a temperature in the range of 950° C. to 1,100° C.

22. A method according to claim 13 wherein said step of forming said polysilicon layer is preceded by the step of forming a pad oxide layer on said semiconductor substrate.

23. A method according to claim 20 wherein said step of forming said isolation layer is followed by the step of:

removing said oxygen diffusing layer, said mask layer, non-oxidized portions of said polysilicon layer, and exposed portions of said pad oxide layer.

24. A method according to claim 13 wherein said patterned mask layer comprises a patterned nitride layer.

25. A method according to claim 1 wherein said substrate includes an oxide layer adjacent said polysilicon layer opposite said patterned masking layer and said oxygen diffusing layer.

26. A method according to claim 25 wherein said substrate comprises a semiconductor substrate adjacent said oxide layer opposite said polysilicon layer.

* * * * *